United States Patent
Ogose et al.

(10) Patent No.: US 12,353,121 B2
(45) Date of Patent: Jul. 8, 2025

(54) REFLECTIVE MASK BLANK, AND REFLECTIVE MASK

(71) Applicant: SHIN-ETSU CHEMICAL CO., LTD., Tokyo (JP)

(72) Inventors: Taiga Ogose, Joetsu (JP); Takuro Kosaka, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 510 days.

(21) Appl. No.: 18/049,674

(22) Filed: Oct. 26, 2022

(65) Prior Publication Data
US 2023/0152680 A1    May 18, 2023

(30) Foreign Application Priority Data
Nov. 17, 2021   (JP) .................................. 2021-187205

(51) Int. Cl.
*G03F 1/24*    (2012.01)
*G03F 1/80*    (2012.01)
*G03F 1/84*    (2012.01)

(52) U.S. Cl.
CPC .................. *G03F 1/24* (2013.01); *G03F 1/80* (2013.01); *G03F 1/84* (2013.01)

(58) Field of Classification Search
CPC ..... G03F 1/24; G03F 1/80; G03F 1/84; G03F 1/54
See application file for complete search history.

(56) References Cited

U.S. PATENT DOCUMENTS

| | | |
|---|---|---|
| 2003/0067598 A1 | 4/2003 | Tomie |
| 2007/0128528 A1* | 6/2007 | Hess .......................... G03F 1/30 430/5 |
| 2012/0141922 A1* | 6/2012 | Deweerd ................... G03F 1/52 430/5 |
| 2015/0160548 A1 | 6/2015 | Mikami |

(Continued)

FOREIGN PATENT DOCUMENTS

| | | |
|---|---|---|
| DE | 10 2009 032 751 A1 | 4/2010 |
| JP | 2002-246299 A | 8/2002 |

(Continued)

OTHER PUBLICATIONS

Extended European Search Report for European Application No. 22207339.7, dated Apr. 12, 2023.

(Continued)

*Primary Examiner* — Stewart A Fraser
(74) *Attorney, Agent, or Firm* — Birch, Stewart, Kolasch & Birch, LLP

(57) ABSTRACT

A reflective mask blank including a substrate, a multilayer reflection film formed on one main surface of the substrate and reflects exposure light. The multilayer reflection film has a periodically laminated structure portion in which low refractive index layers and high refractive index layers are alternately laminated, and at least one of the low refractive index layer has a two-layered structure consisting of one layer containing molybdenum, and at least one additive element selected from the group consisting of nitrogen, carbon, boron, silicon and hydrogen, and the other layer containing molybdenum and substantively free of other elements other than molybdenum.

8 Claims, 2 Drawing Sheets

(56) References Cited

U.S. PATENT DOCUMENTS

2020/0310244 A1   10/2020   Nakagawa et al.
2021/0333702 A1   10/2021   Terasawa et al.

FOREIGN PATENT DOCUMENTS

| JP | 2003-114200 A | 4/2003 |
| JP | 4892984 B2 | 6/2011 |
| JP | 2015-109366 A | 6/2015 |
| JP | 2020-166249 A | 10/2020 |

OTHER PUBLICATIONS

Jörg et al., "The Electro-Mechanical Behavior of Sputter-Deposited Mo Thin Films on Flexible Substrates", Thin Solid Films, vol. 606, 2016, pp. 45-50.

* cited by examiner

REFLECTIVE MASK BLANK, AND REFLECTIVE MASK

CROSS-REFERENCE TO RELATED APPLICATION

This non-provisional application claims priority under 35 U.S.C. § 119(a) on Patent Application No. 2021-187205 filed in Japan on Nov. 17, 2021, the entire contents of which are hereby incorporated by reference.

TECHNICAL FIELD

The present invention relates to a reflective mask used in manufacturing semiconductor devices such as LSIs, and a reflective mask blank which is a material for the reflective mask.

BACKGROUND ART

In a manufacturing process of a semiconductor device, a photolithography technique in which a circuit pattern formed on a transfer mask is transferred onto a semiconductor substrate (a semiconductor wafer) through a reduction projection optical system with irradiating exposure light to the transfer mask is repeatedly used. Conventionally, a mainstream wavelength of the exposure light is 193 nm by argon fluoride (ArF) excimer laser light. A pattern with dimensions smaller than exposure wavelength has finally been formed by adopting a process called multi-patterning in which exposure processes and processing processes are combined multiple times.

However, since it is necessary to form a further fine pattern under continuous miniaturization of device patterns, an extreme ultraviolet (EUV) lithography technique using, as exposure light, extreme ultraviolet (EUV) light having a shorter wavelength than the wavelength of ArF excimer laser light has been developed. The EUV light is light having a wavelength of, for example, about 10 to 20 nm, in particular, light having a wavelength of around 13.5 nm. This EUV light has a very low transparency to a substance and cannot be utilized for a conventional transmissive projection optical system or a mask, thus, a reflection type optical elemental device is applied. Therefore, a reflective mask is also proposed as a mask for the pattern transfer. The reflective mask includes a multilayer reflection film that is formed on a substrate and reflects EUV light, and a patterned absorber film that is formed on the multilayer reflection film and absorbs EUV light. On the other hand, a material (including also a material in which a resist layer is formed) before patterning the absorber film is called a reflective mask blank, and is used as a material for the reflective mask. Generally, a reflective mask and a reflective mask blank that reflect EUV light are so-called an EUV mask and an EUV mask blank, respectively.

The EUV mask blank has a basic structure including a low-thermal expansion substrate, a multilayer reflection film that is formed thereon and reflects EUV light, and generally further including an absorber film that is formed the multilayer reflection film and absorbs EUV light. As the multilayer reflection film, a multilayer reflection film in which molybdenum (Mo) films and silicon (Si) films are alternately laminated to obtain a necessary reflectance for EUV light is usually used. Further, as a protection layer for protecting the multilayer reflection film, a ruthenium (Ru) film is formed as the outermost layer of the multilayer reflection film. On the other hand, for the absorber film, a material containing tantalum (Ta) or the like, which has a relatively large extinction coefficient with respect to EUV light, is used (Patent Document 1: JP-A 2002-246299).

CITATION LIST

Patent Document 1: JP-A 2002-246299
Patent Document 2: JP-A 2003-114200

SUMMARY OF THE INVENTION

In manufacturing steps of a reflective mask, after forming a pattern by etching processing of an absorber film of a reflective mask blank, usually, the pattern is inspected, and corrected a defect if the defect has been detected. However, in the case of the reflective mask, a defect so-called a phase defect that causes a decrease in reflectance due to disorder of structure of the multilayer reflection film exists in some cases. It is very difficult to correct directly this phase defect after the pattern of the absorber film has been formed. From this circumstance, it is important to detect the phase defect of the reflective mask blank. For example, a technique utilizing a dark-field inspection image is disclosed in JP-A 2003-114200 (Patent Document 2) as a method for detecting defects inside a multilayer reflection film with using EUV light.

In order to detect sensitively a fine phase defect in defect detection, after forming the multilayer reflection film, it is needed to lower an intensity in defect inspection of scattered light at a portion where defects do not exist in the multilayer reflection film, i.e., a background level (BGL). Therefore, for a reflective mask blank (an EUV mask blank), a high reflectance with respect to exposure light (EUV light having a wavelength of about 13.5 nm) is advantageous. Meanwhile, it is needed that the background level is lowered in the defect inspection.

In the case that the multilayer reflection film is formed so as to have a periodically laminated structure of molybdenum (Mo) layers and silicon layers, molybdenum (Mo) not containing an additive element such as nitrogen (N), carbon (C) and boron (B) tends to have a higher reflectance. However, when crystal grains coarsen in forming the molybdenum (Mo) layer, either or both of an interface roughness between layers, and a surface roughness of the multilayer reflection film increase, resulting increase of the back ground level in defect inspection.

On the other hand, in order to decrease the background level, it is effective to form amorphous structure by adding an additive element such as nitrogen (N), carbon (C) and boron (B) to molybdenum (Mo). However, a reflectance is significantly decreased by changes of optical properties (n, k) due to influence of the additive element, or acceleration of intermixing of both components at the interface portion of molybdenum (Mo) layer and silicon (Si) layer.

The present invention has been made to solve the above problems, and an object of the present invention is to provide a reflective mask blank and a reflective mask that include a multilayer reflection film having a high reflectance and a controlled low background level in defect inspection.

The inventors have made earnestly studies to solve the above problems. As a result, in a multilayer reflection film having a periodically laminated structure portion in which low refractive index layers and high refractive index layers are alternately laminated, and preferably having a protection layer that is formed at the side remote from the substrate and in contact with the periodically laminated structure portion, the inventors found the low refractive index layer that has a two-layered structure consisting of one layer containing molybdenum (Mo), and at least one additive element selected from the group consisting of nitrogen (N), carbon (C), boron (B), silicon (Si) and hydrogen (H), and the other layer containing molybdenum (Mo) and being substantively free of other elements other than molybdenum (Mo). Further, the inventers found that the multilayer reflection film has a sufficiently lowed background level (BGL) in defect inspection with a sufficiently high reflectance with respect to exposure light.

In one aspect, the invention provides a reflective mask blank including a substrate, a multilayer reflection film formed on one main surface of the substrate and reflects exposure light, wherein the multilayer reflection film has a periodically laminated structure portion in which low refractive index layers and high refractive index layers are alternately laminated, at least one of the low refractive index layers constituting the multilayer reflection film has a two-layered structure consisting of a first sublayer and a second sublayer, the first sublayer contains molybdenum (Mo), and at least one additive element selected from the group consisting of nitrogen (N), carbon (C), boron (B), silicon (Si) and hydrogen (H), and has a thickness of more than 0.3 nm and not more than 0.6 nm, and the second sublayer contains molybdenum (Mo) and is substantively free of other elements other than molybdenum (Mo).

Preferably, in the low refractive index layer, the first sublayer is formed at the side of the substrate, and the second sublayer is formed at the side remote from the substrate.

Preferably, the high refractive index layer contains silicon (Si).

Preferably, the multilayer reflection film has a crystalline diameter of not less than 2.6 nm that is calculated from the X-ray diffraction peak of Mo (110) detected in X-ray diffraction.

Preferably, the substrate has dimensions of 152 mm-square of the one main surface and 6.35 mm of thickness, and an amount of change in flatness (ΔTIR) within a range of 142 mm-square at the center of the one main surface that is a difference of flatnesses before and after forming the multilayer reflection film is not more than 0.7 μm as an absolute value.

Preferably, the reflective mask blank includes a protection layer that is formed at the side remote from the substrate and in contact with the periodically laminated structure portion.

Preferably, the reflective mask blank further includes an absorber film that absorbs the exposure light on the multilayer reflection film.

In another aspect, the invention provides a reflective mask including a pattern formed by patterning the absorber film of the reflective mask blank

ADVANTAGEOUS EFFECTS OF THE INVENTION

According to the invention, a reflective mask blank that includes a multilayer reflection film having a sufficiently lowed background level in defect inspection with a high reflectance with respect to exposure light can be provided.

BRIEF DESCRIPTION OF THE DRAWINGS

FIG. 1A is a reflective mask blank in which a multilayer reflection film consists of a periodically laminated structure portion, and FIG. 1B is a reflective mask blank in which a multilayer reflection film consists of a periodically laminated structure portion and a protection layer.

FIG. 2A is a reflective mask blank in which a multilayer reflection film consists of a periodically laminated structure portion, and FIG. 2B is a reflective mask blank in which a multilayer reflection film consists of a periodically laminated structure portion and a protection layer.

DESCRIPTION OF THE PREFERRED EMBODIMENT

A reflective mask blank of the invention includes a substrate, and a multilayer reflection film formed on one main surface (front side surface) of the substrate and reflects exposure light, in particular, EUV light. The reflective mask blank of the invention is suitable for a material used in manufacturing a reflective mask. The multilayer reflection film of the invention has a periodically laminated structure portion in which low refractive index layers and high refractive index layers are alternately laminated. The multilayer reflection film of the invention may further include a protection layer that is formed at the side remote from the substrate and in contact with the periodically laminated structure portion. The multilayer reflection film of the invention preferably consists of the periodically laminated structure portion, or the periodically laminated structure portion and the protection layer. The multilayer reflection film is a film that reflects EUV light as exposure light in a reflective mask. The multilayer reflection film may be formed in contact with the substrate, and an underlayer may be formed between the substrate and the multilayer reflection film.

The reflective mask blank of the invention is suitable for a material (an EUV mask blank) for a reflective mask (an EUV mask) used in EUV lithography utilizing EUV light as exposure light. A wavelength of EUV light used in EUV lithography utilizing EUV light as exposure light is 13 to 14 nm, normally about 13.5 nm. The EUV mask blank and the EUV mask are kinds of the reflective mask blank and the reflective mask, respectively.

Figure 1A:
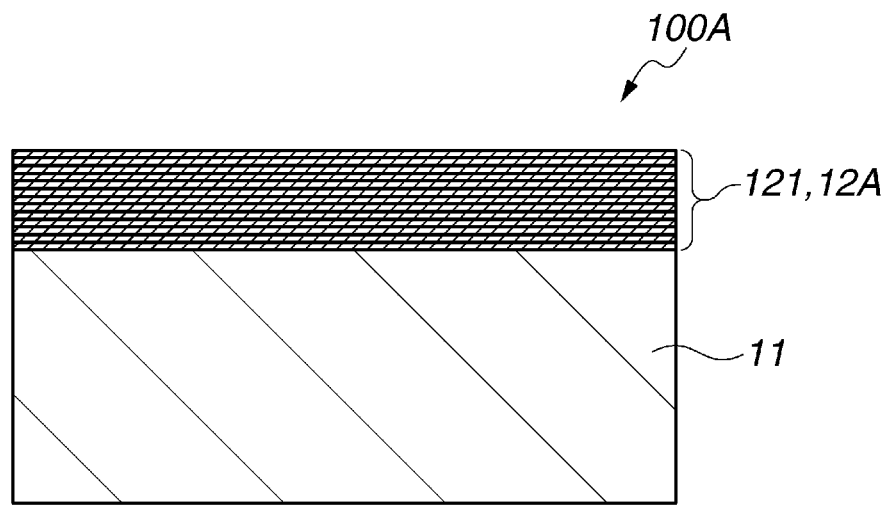
FIGS. 1A and 1B are cross-sectional views illustrating examples of first embodiment of a reflective mask blank of the invention.
Figure 1B:
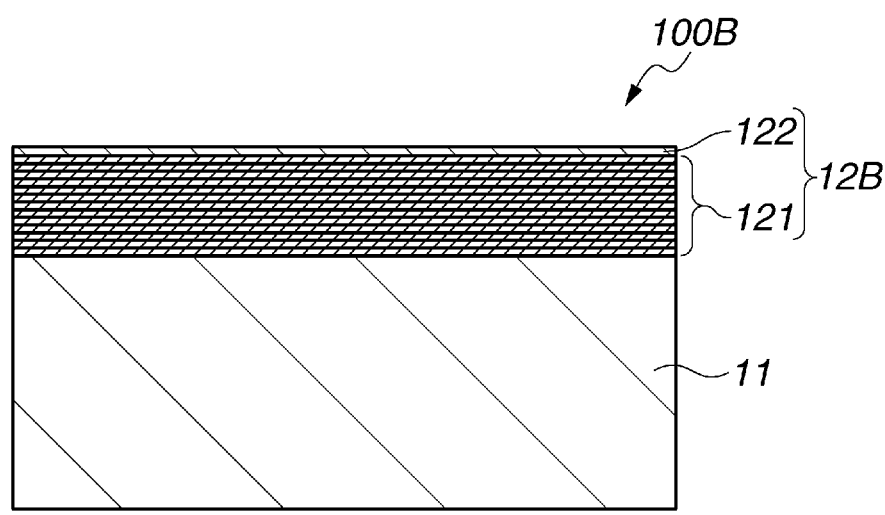

FIGS. 1A and 1B are cross-sectional views illustrating examples of first embodiment of a reflective mask blank of the invention. These reflective mask blanks 100A, 100B include a substrate 11, and a multilayer reflection film 12A, 12B formed on one main surface of the substrate 11 and in contact with the substrate 11, respectively. The multilayer reflection film 12A in FIG. 1A is constructed of a periodically laminated structure portion 121 in which low refractive index layers consisting of two layers, from the substrate side, a first sublayer and a second sublayer, and high refractive index layers are alternately laminated. On the other hand, the multilayer reflection film 12B in FIG. 1B is constructed of a periodically laminated structure portion 121 in which low refractive index layers consisting of two layers, from the substrate side, a first sublayer and a second sublayer, and high refractive index layers are alternately laminated, and a protection layer 122.

A reflective mask (an EUV mask) including a pattern of multilayer reflection film can be formed by using the reflective mask blank (an EUV mask blank) in which the multilayer reflection film is formed, and patterning the multilayer reflection film. However, generally, an absorber film, as a pattern-forming film, may be further formed on the multilayer reflection film to prepare a reflective mask blank (an EUV mask blank) including the substrate, the multilayer reflection film and the absorber film, and a reflective mask (an EUV mask) is manufactured by patterning the absorber film.

The reflective mask blank of the invention may further include an absorber film that is formed on the multilayer reflection film and absorbs exposure light. In particular, as the reflective mask blank, a reflective mask blank including a substrate, a multilayer reflection film formed on one main surface of the substrate and reflects exposure light, an absorber film that is formed on the multilayer reflection film and absorbs the exposure light is exemplified. The absorber film is a film that absorbs exposure light, in particular, EUV light, and reduces a reflectance with respect to the exposure light. The absorber film is preferably formed in contact with the multilayer reflection film (the periodically laminated structure portion or the protection layer in the multilayer reflection film).

Figure 2A:
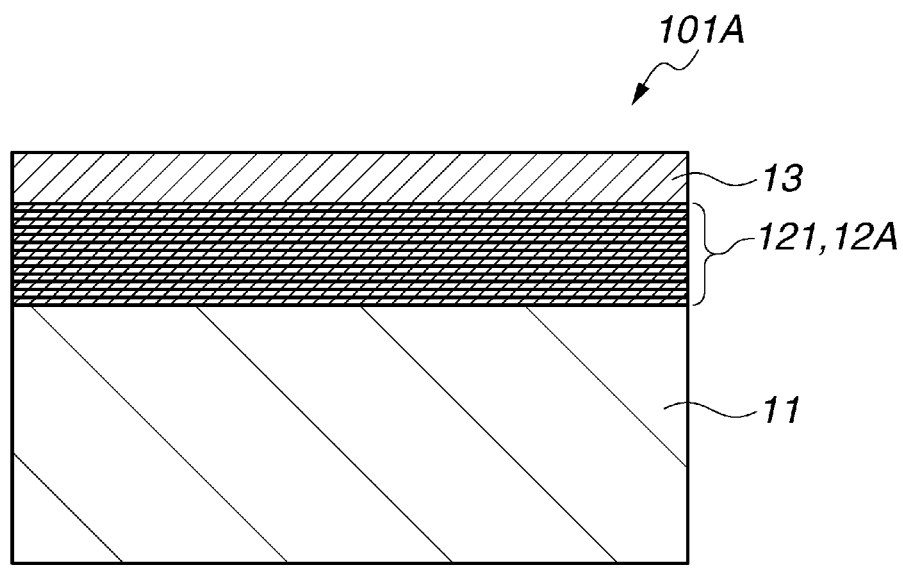
FIGS. 2A and 2B are cross-sectional views illustrating examples of second embodiment of a reflective mask blank of the invention.
Figure 2B:
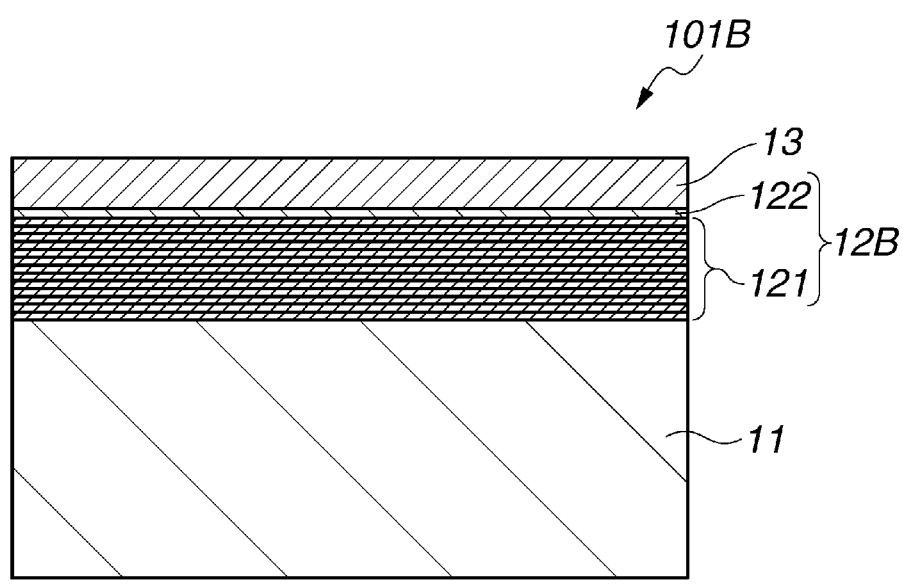

FIGS. 2A and 2B are cross-sectional views illustrating examples of second embodiment of a reflective mask blank of the invention. These reflective mask blanks 101A, 101B include a substrate 11, a multilayer reflection film 12A, 12B formed on one main surface of the substrate 11 and in contact with the substrate 11, and an absorber film 13 formed in contact with the multilayer reflection film 12A, 12B, respectively. The multilayer reflection film 12A in FIG. 2A is constructed of a periodically laminated structure portion 121 in which low refractive index layers consisting of two layers, from the substrate side, a first sublayer and a second sublayer, and high refractive index layers are alternately laminated. On the other hand, the multilayer reflection film 12B in FIG. 2B is constructed of a periodically laminated structure portion 121 in which low refractive index layers consisting of two layers, from the substrate side, a first sublayer and a second sublayer, and high refractive index layers are alternately laminated, and a protection layer 122.

A reflective mask (an EUV mask) including an absorber pattern (a pattern of absorber film) formed by patterning the absorber film can be manufactured from a reflective mask blank (an EUV mask blank) including an absorber film.

For EUV light exposure, the substrate preferably has low-thermal expansion property. For example, the substrate is preferably composed of a material having a coefficient of thermal expansion within $\pm 2 \times 10^{-8}/°$ C., preferably $\pm 5 \times 10^{-9}/°$ C. Further, a substrate having a sufficiently flatted surface is preferably used. A surface roughness of the main surface of the substrate, as an RMS value, is preferably not more than 0.5 nm, more preferably not more than 0.2 nm. Such a surface roughness can be obtained by polishing the substrate. Examples of the materials for the substrate include titania-doped quartz glasses ($SiO_2$—$TiO_2$-based glasses). The substrate preferably has dimensions of 152 mm-square of one main surface and 6.35 mm of thickness. The substrate having the dimensions is so-called a 6025 substrate that has dimensions 6 inch-square of one main surface and 0.25 inch of thickness.

In the invention, at least one of the low refractive index layers, preferably, all of the low refractive index layers constituting the multilayer reflection film have a two-layered structure consisting of a first sublayer and a second sublayer. The low refractive index layer is composed of a material containing molybdenum (Mo).

The first sublayer is a layer that contains molybdenum (Mo), and at least one additive element selected from the group consisting of nitrogen (N), carbon (C), boron (B), silicon (Si) and hydrogen (H). The first sublayer is preferably a film having an amorphous structure. Preferably, the first sublayer contains molybdenum (Mo) as a main component, and a molybdenum content in the first sublayer is preferably not less than 60 at %, more preferably not less than 80 at %. On the other hand, an amount of the additive element is preferably an amount that can form an amorphous structure in the first sublayer. A content of the additive element in the first sublayer is preferably not less than 1 at %, more preferably not less than 10 at %, and preferably not more than 40 at %, more preferably not more than 20 at %.

The second sublayer is a layer that contains molybdenum (Mo) and is substantively free of other elements other than molybdenum (Mo), in other words, a layer consisting of molybdenum (Mo) that may contains inevitable impurities. The second sublayer is preferably a layer having high crystallinity and a dense layer.

The low refractive index layer has a thickness of preferably not less than 2.1 nm, more preferably not less than 2.6 nm, and preferably not more than 3.5 nm, more preferably not more than 3 nm. In the low refractive index layer, the first sublayer has a thickness of preferably more than 0.3 nm, more preferably not less than 0.4 nm, and not more than 0.6 nm. When the first sublayer has a thickness of not more than 0.6 nm, the reflectance with respect to exposure light (EUV light) can be maintained high. Further, when the first sublayer has a thickness of more than 0.3 nm, particularly not less than 0.4 nm, the multilayer reflection film can have a sufficiently low background level (BGL) in defect inspection.

In the low refractive index layer, the first sublayer is preferably formed at the side of the substrate, and the second sublayer is preferably formed at the side remote from the substrate. By disposing the first sublayer and the second sublayer as the positions, the first sublayer having an amorphous structure can be formed onto the high refractive index layer, and after forming the second sublayer, the high refractive index layer can be formed onto the second sublayer that has high crystallinity and is dense. By forming the sublayers in such a way, either or both of an interface roughness between the low-refraction index layer and the high refractive index layer caused by coarsening of crystal grains, and a surface roughness of the multilayer reflection film can be reduced.

The high refractive index layer is preferably a layer that contains silicon (Si). Preferably, the high refractive index contains silicon (Si) as a main component, and a silicon content in the high refractive index layer is preferably not less than 80 at %, more preferably not less than 90 at %. The high refractive index layer may contain at least one additive element selected from the group consisting of oxygen (O), nitrogen (N), carbon (C), boron (B) and hydrogen (H). The high refractive index layer may be composed of a plurality of layers including a layer containing the additive element and a layer not containing the additive element. The high refractive index layer has a thickness of preferably not less than 3.5 nm, more preferably not less than 4 nm, and preferably not more than 4.9 nm, more preferably not more than 4.4 nm.

The periodically laminated structure portion in which low refractive index layers and high refractive index layers are alternately laminated has a thickness of preferably not less than 200 nm, more preferably not less than 270 nm, and preferably not more than 400 nm, more preferably not more than 290 nm.

Examples of methods for forming the periodically laminated structure portion include a sputtering method in which, to perform sputtering, power is supplied to a target, and plasma of an atmospheric gas is formed (an atmospheric gas is ionized) by the supplied power, and an ion beam sputtering method in which a target is irradiated with ion beam. The sputtering methods include a DC sputtering method in which a DC voltage is applied to a target, and an RF sputtering method in which a high frequency voltage is applied to a target. The sputtering method is a film forming method that utilizes sputtering phenomenon by gas ions generated by applying a voltage to a target with feeding a sputtering gas into a chamber to ionize the gas. Particularly, a magnetron sputtering method has an advantage in productivity. The power may be applied to the target by a DC system or an RF system. The DC system includes also a pulse sputtering in which a negative bias applied to the target is inverted for a short time to prevent charge-up of the target.

The periodically laminated structure portion may be formed by, for example, a sputtering method using a sputtering apparatus to which a plurality of targets can be attached. In particular, the periodically laminated structure portion may be formed by using, as targets, targets appropriately selected from the group consisting of a molybdenum (Mo) target for forming a molybdenum (Mo)-containing layer, a silicon (Si) target for forming a silicon (Si)-containing layer, and other targets, and using, as a sputtering gas, a rare gas such as helium (He) gas, argon (Ar) gas, krypton (Kr) gas and xenon (Xe) gas. Further, in the case that the sputtering is a reactive sputtering using a sputtering gas, for example, a nitrogen-containing gas such as nitrogen gas ($N_2$ gas) to form a nitrogen (N)-containing film, an oxygen-containing gas such as oxygen gas ($O_2$ gas) to form an oxygen (O)-containing film, a nitrogen oxide gas such as nitrous oxide ($N_2O$) gas, nitrogen monoxide (NO) gas and nitrogen dioxide ($NO_2$) gas to form a nitrogen (N) and oxygen (O)-containing film, a carbon oxide gas such as carbon monoxide (CO) gas and carbon dioxide ($CO_2$) gas to form a carbon (C) and oxygen (O)-containing film, a hydrogen-containing gas such as hydrogen ($H_2$) gas to form a hydrogen (H)-containing film, or a hydrocarbon gas such as methane ($CH_4$) gas to form a carbon (C) and hydrogen (H)-containing film may be used with the rare gas. Moreover, a molybdenum (Mo) target added with boron (B) (a molybdenum boride (MoB) target), a silicon (Si) target added with boron (B) (a silicon boride (SiB) target) to form a boron (B)-containing layer may be used.

The protection layer is also called a capping layer, and is formed to protect the periodically laminated structure portion in the multilayer reflection film when the absorber film thereon is patterned or a pattern of the absorber film is corrected. A material for the protection layer is preferably a material containing ruthenium (Ru). As the material containing ruthenium (Ru), ruthenium (Ru) simple substance, or a compound of ruthenium (Ru) added with niobium (Nb) or zirconium (Zr) is preferably used. The protection layer has a thickness of normally not more than 5 nm, particularly not more than 4 nm. A lower limit of the thickness of the protection layer is normally not less than 2 nm.

As same as the periodically laminated structure portion, the protection layer can be formed by, for example. a sputtering method such as an ion beam sputtering method or a magnetron sputtering method. The protection layer may be formed by, for example, a sputtering method using a sputtering apparatus to which one target or a plurality of targets can be attached. In particular, the protection layer may be formed by sputtering using a target selected from the group consisting of a ruthenium (Ru) target, a ruthenium (Ru) target added with niobium (Nb) or zirconium (Zr), and an optional target of at least one element selected from the group consisting of niobium (Nb) and zirconium (Zr), and using, as a sputtering gas, a rare gas such as helium (He) gas, argon (Ar) gas, krypton (Kr) gas and xenon (Xe) gas. When the protection layer is formed of a compound containing an element other than a metal, the protection layer can be formed by reactive sputtering using, as the sputtering gas, a reactive gas such as an oxygen-containing gas, a nitrogen-containing gas and a carbon-containing gas with the rare gas. Further, the target may be a compound.

A reflectance of the multilayer reflection film depends on the composition and layer structure of the multilayer reflection film. For example, the reflectance at an incident angle of 6° is preferably not less than 65%, more preferably not less than 66%, even more preferably not less than 67%, with respect to extreme ultraviolet (EUV) ray.

In the invention, the multilayer reflection film has a crystalline diameter of not less than 2.6 nm that is calculated from the X-ray diffraction peak of Mo (110) detected in X-ray diffraction. In such a multilayer reflection film, the refractive index of the low refractive index layer with respect to exposure light (EUV light) is low, and the reflectance of the multilayer reflection film is higher.

Further, in the invention, when the substrate has dimensions of 152 mm-square of the one main surface and 6.35 mm of thickness, an amount of change in flatness (ΔTIR) within a range of 142 mm-square at the center of the one main surface that is a difference of flatnesses before and after forming the multilayer reflection film, in particular, before and after forming the periodically laminated structure portion, or before and after forming both the periodically laminated structure portion and the protection layer, is preferably not more than 0.7 μm as an absolute value.

The absorber film is formed on the multilayer reflection film, and absorbs EUV light, which is exposure light, and is a film to reduce a reflectance of the exposure light. In the reflective mask, a transfer pattern is formed by a difference of reflectances between the portion where the absorber film is formed and the portion where the absorber film is not formed.

A material for the absorber film is not limited as long as the material can absorb EUV light and is processible to a pattern. Examples of the materials of the absorber film include, for example, a material containing tantalum (Ta) or chromium (Cr). The material containing Ta or Cr may contain oxygen (O), nitrogen (N), carbon (C), boron (B), or other elements. Examples of the materials containing Ta include, for example, Ta simple substance, and a tantalum compound such as TaO, TaN, TaON, TaC, TaCN, TaCO, TaCON, TaB, TaOB, TaNB, TaONB, TaCB, TaCNB, TaCOB and TaCONB. Examples of the materials containing Cr include, for example, Cr simple substance, and a chromium compound such as CrO, CrN, CrON, CrC, CrCN, CrCO, CrCON, CrB, CrOB, CrNB, CrONB, CrCB, CrCNB, CrCOB and CrCONB.

The absorber film can be formed by a sputtering method, and the sputtering is preferably a magnetron sputtering. In particular, the absorber film may be formed by a sputtering using a metal target such as a chromium (Cr) target and a tantalum (Ta) target or a metal compound target such as a chromium compound target and a tantalum compound target (a target containing a metal such as Cr and Ta, and at least one element selected from the group consisting of oxygen (O), nitrogen (N), carbon (C), boron (B), and other elements), and using, as a sputtering gas, a rare gas such as helium (He) gas, argon (Ar) gas, krypton (Kr) gas and xenon (Xe) gas, or a reactive sputtering using, as the sputtering gas, the rare gas with a reactive gas such as an oxygen-containing gas, a nitrogen-containing gas and a carbon-containing gas. The absorber film has a thickness of normally about 60 to 80 nm, however, not limited thereto.

The reflective mask blank may further include a hard mask film that acts as an etching mask when an absorber film is dry-etched on the absorber film. On the other hand, a conductive film used for electrostatic chucking to attach the reflective mask to an exposure apparatus may be formed on the other main surface (back side surface) which is opposite across the substrate to the one main surface, preferably in contact with the other main surface.

At the side remote from the substrate on the absorber film, a hard mask film (an etching mask film for the absorber film) having different etching properties from the absorber film may be formed, preferably in contact with the absorber film. The hard mask film is a film that acts as an etching mask when the absorber film is dry-etched. After the absorber pattern is formed, the hard mask film may be left as, for example, a reflectance reducing film for reducing the reflectance at a wavelength of light used in inspection such as pattern inspection and as a part of the absorber film, or may be removed to be absent on the reflective mask. Examples of the materials of the hard mask film include a material containing chromium (Cr). Particularly, a hard mask film composed of a material containing Cr is preferable in the case that the absorber film is composed of a material containing Ta and free of Cr. When a layer that mainly assumes a function for reducing the reflectance at a wavelength of light used in inspection such as pattern inspection (a reflectance reducing layer) is formed on the absorber film, the hard mask film may be formed on the reflectance reducing layer of the absorber film. The hard mask film may be formed by, for example, a magnetron sputtering method. The hard mask has a thickness of normally about 5 to 20 nm, however, not limited thereto.

The conductive film preferably has a sheet resistance of not more than 100 Ω/square, and a material for the conductive film is not limited. Examples of the materials of the conductive film include, for example, a material containing tantalum (Ta) or chromium (Cr). The material containing Ta or Cr may contain oxygen (O), nitrogen (N), carbon (C), boron (B), or other elements. Examples of the materials containing Ta include, for example, Ta simple substance, and a tantalum compound such as TaO, TaN, TaON, TaC, TaCN, TaCO, TaCON, TaB, TaOB, TaNB, TaONB, TaCB, TaCNB, TaCOB and TaCONB. Examples of the materials containing Cr include, for example, Cr simple substance, and a chromium compound such as CrO, CrN, CrON, CrC, CrCN, CrCO, CrCON, CrB, CrOB, CrNB, CrONB, CrCB, CrCNB, CrCOB and CrCONB.

The conductive film has a thickness of normally about 20 to 30 nm, however, not limited thereto as long as the thickness is enough to function for use in electrostatic chucking. The conductive film is preferably formed so as to have a thickness at which film stresses between the conductive film, and the multilayer reflection film and the absorber pattern are balanced after obtaining the reflective mask, in other words, after forming the absorber pattern. The conductive film may be formed before forming the multilayer reflection film, or after forming all the films on the multilayer reflection film side of the substrate. After forming a part of the films at the multilayer reflection film side of the substrate, the conductive film may be formed, and then the remainder of the films at the multilayer reflection film side of the substrate may be formed. The conductive film can be formed by, for example, a magnetron sputtering method.

Further, the reflective mask blank may include a resist film formed on the side remotest from the substrate. The resist film is preferably an electron beam (EB) resist.

EXAMPLES

Examples of the invention are given below by way of illustration and not by way of limitation.

Examples 1 to 3

A multilayer reflection film was formed on a low-thermal expansion substrate ($SiO_2$—$TiO_2$-based glass substrate) having dimensions of 152 mm-square and 6.35 mm-thick while rotating the substrate by DC pulse magnetron sputtering with using a molybdenum (Mo) target and a silicon (Si) target that were placed so as to face to the main surface of the substrate. Each of the targets was attached to a sputtering apparatus that is capable of attaching two targets and discharging the targets one by one, or both targets at the same time, and the substrate was placed into the sputtering apparatus.

First, a silicon (Si) layer, as a high refractive index layer, having a thickness of 4.2 nm was formed with applying an electric power to the silicon (Si) target while feeding argon (Ar) gas (flow rate: 12 SCCM) into a chamber, then, the application of electric power to the silicon target was terminated.

Next, a molybdenum nitride layer (MoN layer), as a first sublayer of a low refractive index layer, was formed with applying an electric power to the molybdenum (Mo) target while feeding both argon (Ar) gas (flow rate: 14 SCCM) and nitrogen ($N_2$) gas (flow rate: 15 SCCM) into the chamber, then, the application of electric power to the molybdenum target was terminated. The molybdenum nitride layer was formed under conditions so that the molybdenum nitride has an amorphous structure. The thicknesses of the first sublayers were set to 0.4 nm in Example 1, 0.5 nm in Example 2, and 0.6 nm in Example 3, respectively.

Next, a simple molybdenum layer (Mo layer), as a second sublayer of the low refractive index layer, was formed with applying an electric power to the molybdenum (Mo) target while feeding argon (Ar) gas (flow rate: 15 SCCM) into the chamber, then, the application of electric power to the molybdenum (Mo) target was terminated. The thicknesses of the second sublayers were adjusted so as to obtain a thickness of 2.8 nm as the sum of the first sublayer and the second sublayer, respectively.

The one cycle which is a set of the formations of the low refractive index layer and the high refractive index layer was repeated for 40 cycles, and after forming the low refractive index at 40th cycle, a silicon (Si) layer having a thickness of 4.2 nm, as an uppermost layer, was formed by the above-described method. Accordingly, a periodically laminated structure portion of the multilayer reflection film was formed. The thickness of each layer can be controlled by adjusting the power applied to the target, a time for power application to the target, or both. The formed thickness can be confirmed, for example, by a transmission microscope (TEM-EDX) image utilizing energy dispersive X-ray spectroscopy in a cross section of the layer.

Next, on the periodically laminated structure portion, a protection layer was formed in contact with the periodically laminated structure portion while rotating the substrate by DC pulse magnetron sputtering with using a ruthenium (Ru)

target that was placed so as to face to the main surface of the substrate. First, after forming the periodically laminated structure portion, the substrate having the formed periodically laminated structure portion was transported without taking it out to the atmosphere, from the sputtering apparatus in which the periodically laminated structure portion was formed, through a transport path which was maintained in vacuum condition, and was placed into the other sputtering apparatus to which the ruthenium (Ru) target was attached.

Next, a simple ruthenium layer (Ru layer) having a thickness of 2.5 nm was formed with applying an electric power to the ruthenium target while feeding argon gas (flow rate: 10 SCCM) into a chamber, then, the application of electric power to the ruthenium target was terminated. Accordingly, the multilayer reflection film consisting of the periodically laminated structure portion and the protection layer was obtained.

A reflectance spectrum with respect to EUV light (a wavelength of 13 to 14 nm) at an incident angle of 6° was measured for the obtained multilayer reflection film by an EUV mask fully automatic reflectometer (LPR-1016, manufactured by EUV Tech). A background level (BGL) during inspection was measured by an EUV mask blank defect inspection/review device (ABICS E120, manufactured by Lasertec Corporation) using EUV light as inspection light. As a result, a center wavelength of the EUV reflection spectrum, (a wavelength corresponding to the midpoint of the half-width of the main maximum peak) was 13.53±0.04 nm, and maximum reflectances were 67.11% in Example 1, 66.74% in Example 2, and 66.29% in Example 3, respectively. The background levels (BGL) were 374 in Example 1, 371 in Example 2, and 374 in Example 3, respectively.

Further, out-of-plane measurement of the obtained multilayer reflection film was performed by an X-ray diffractometer equipped with a Cu anticathode (SmartLab, manufactured by Rigaku Corporation) to obtain an X-ray diffraction profile of the multilayer reflection film. A crystallite diameter of Mo was calculated from the observed Mo (110) diffraction peak by the following Scherrer equation:

Crystallite diameter (nm)=$K\lambda/\beta \cos \theta$, wherein K is a Scherrer constant (0.9), $\lambda$, is X-ray wavelength in the measurement (0.15418 nm), $\beta$ is a half width of the diffraction peak in radians unit, and $\theta$ is a Bragg angle of the diffraction peak. The calculated crystallite diameters of Mo were 2.8 nm in Example 1, 2.7 nm in Example 2, and 2.6 nm in Example 3, respectively, and it was confirmed that Mo has high crystallinity.

Further, with respect to the substrate before forming the multilayer reflection film, and the substrate after forming the multilayer reflection film, i.e., the obtained substrate on which the multilayer reflection film had been formed (a reflective mask blank), flatnesses (TIR) within a range of 142 mm-square at the center of the one main surface were measured by a mask flatness measuring device (UltraFlat 200, manufactured by Tropel Corporation). An amount of change in flatness (ΔTIR) was calculated from the flatnesses (TIR) before and after forming the multilayer reflection film. The ΔTIRs were 0.60 µm in Example 1, 0.57 µm in Example 2, and 0.56 µm in Example 3, respectively, in absolute value.

Comparative Example 1

A multilayer reflection film was formed as the same manner in Example 1 except that the thickness of the molybdenum nitride layer was set to 0.3 nm. The center wavelength of the EUV reflection spectrum, the maximum reflectance, the BGL and the crystallite diameter of Mo were evaluated as the same manner in Example 1. Further, with respect to the obtained substrate on which the multilayer reflection film had been formed (a reflective mask blank), the ΔTIR was evaluated as the same manner in Example 1. As a result, the center wavelength of the EUV reflection spectrum was 13.53±0.04 nm, and the maximum reflectance were 67.64% which is a high value, however, the BGL was 437 which is high. Further, the crystallite diameter of Mo was 2.9 nm, and the ΔTIR was 0.70 µm in absolute value.

Comparative Example 2

A multilayer reflection film was formed as the same manner in Example 1 except that the thickness of the molybdenum nitride layer was set to 0.7 nm. The center wavelength of the EUV reflection spectrum, the maximum reflectance, the BGL and the crystallite diameter of Mo were evaluated as the same manner in Example 1. Further, with respect to the obtained substrate on which the multilayer reflection film had been formed (a reflective mask blank), the ΔTIR was evaluated as the same manner in Example 1. As a result, the center wavelength of the EUV reflection spectrum was 13.53±0.04 nm, and the maximum reflectance were 64.25% which is a low value, and the BGL was 490 which is high. Further, the crystallite diameter of Mo was 2.5 nm, and the ΔTIR was 0.73 µm in absolute value.

Comparative Example 3

A multilayer reflection film was formed as the same manner in Example 1 except that the molybdenum nitride layer was not formed to form the low-reflective index layer consisting of a simple molybdenum layer having a thickness of 2.8 nm. The center wavelength of the EUV reflection spectrum, the maximum reflectance, the BGL and the crystallite diameter of Mo were evaluated as the same manner in Example 1. Further, with respect to the obtained substrate on which the multilayer reflection film had been formed (a reflective mask blank), the ΔTIR was evaluated as the same manner in Example 1. As a result, the center wavelength of the EUV reflection spectrum was 13.53±0.04 nm, and the maximum reflectance were 67.50% which is a high value, however, the BGL was 488 which is high. Further, the crystallite diameter of Mo was 3.1 nm, and the ΔTIR was 1.10 µm in absolute value.

Japanese Patent Application No. 2021-187205 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A reflective mask blank comprising a substrate, a multilayer reflection film formed on one main surface of the substrate and reflects exposure light, wherein
   the multilayer reflection film has a periodically laminated structure portion in which low refractive index layers and high refractive index layers are alternately laminated,
   at least one of the low refractive index layers constituting the multilayer reflection film has a two-layered structure consisting of a first sublayer and a second sublayer,
   the first sublayer comprises molybdenum (Mo), and at least one additive element selected from the group consisting of nitrogen (N), carbon (C), boron (B), silicon (Si) and hydrogen (H), and has a thickness of more than 0.3 nm and not more than 0.6 nm, and the second sublayer comprises molybdenum (Mo) and is substantively free of other elements other than molybdenum (Mo).

2. The reflective mask blank of claim 1 wherein in the low refractive index layer, the first sublayer is formed at the side of the substrate, and the second sublayer is formed at the side remote from the substrate.

3. The reflective mask blank of claim 1 wherein the high refractive index layers comprise silicon (Si).

4. The reflective mask blank of claim 1 wherein the multilayer reflection film has a crystalline diameter of not less than 2.6 nm that is calculated from the X-ray diffraction peak of Mo (110) detected in X-ray diffraction.

5. The reflective mask blank of claim 1 wherein
the substrate has dimensions of 152 mm-square of the one main surface and 6.35 mm of thickness, and
an amount of change in flatness (ΔTIR) within a range of 142 mm-square at the center of the one main surface that is a difference of flatnesses before and after forming the multilayer reflection film is not more than 0.7 μm as an absolute value.

6. The reflective mask blank of claim 1 comprising a protection layer that is formed at the side remote from the substrate and in contact with the periodically laminated structure portion.

7. The reflective mask blank of claim 1 further comprising an absorber film that absorbs the exposure light on the multilayer reflection film.

8. A reflective mask comprising a pattern formed by patterning the absorber film of the reflective mask blank of claim 7.

* * * * *